(12) United States Patent
Nakatani et al.

(10) Patent No.: US 7,710,181 B2
(45) Date of Patent: May 4, 2010

(54) VARIABLE ATTENUATOR AND WIRELESS COMMUNICATION DEVICE

(75) Inventors: Toshifumi Nakatani, Osaka (JP); Takahito Miyazaki, Kyoto (JP)

(73) Assignee: Panasonic Corporation, Osaka (JP)

( * ) Notice: Subject to any disclaimer, the term of this patent is extended or adjusted under 35 U.S.C. 154(b) by 3 days.

(21) Appl. No.: 12/193,114

(22) Filed: Aug. 18, 2008

(65) Prior Publication Data
US 2009/0072932 A1     Mar. 19, 2009

(30) Foreign Application Priority Data
Aug. 20, 2007   (JP) .............................. 2007-213820

(51) Int. Cl.
*H01P 1/22*     (2006.01)
(52) U.S. Cl. .................................... 327/308; 333/81 R
(58) Field of Classification Search ................. 327/306, 327/308; 333/81 R
See application file for complete search history.

(56) References Cited

U.S. PATENT DOCUMENTS 6,236,259 B1 *   5/2001   Goodell et al. .............. 327/534
6,320,408 B1 *  11/2001   Kwong ......................... 326/31
7,205,817 B1 *   4/2007   Huang et al. ................ 327/308

FOREIGN PATENT DOCUMENTS

| JP | 9-46175 | 2/1997 |
|---|---|---|
| JP | 3216808 | 8/2001 |
| JP | 2005-244877 | 9/2005 |
| JP | 3784664 | 3/2006 |

* cited by examiner

*Primary Examiner*—Dinh T. Le
(74) *Attorney, Agent, or Firm*—Wenderoth, Lind & Ponack, L.L.P.

(57) ABSTRACT

A variable attenuator, used with high frequency, provides large variable attenuation per stage. The variable attenuator includes: a MOSFET having a gate, a drain, a source, and a body; an attenuation control circuit; and a temperature characteristics compensation circuit. The attenuation control circuit supplies a control voltage to the gate, the drain, and the source. The temperature characteristics compensation circuit supplies a temperature compensation voltage to the body. An input terminal and an output terminal are connected to the drain and the source of the MOSFET. The temperature characteristics compensation circuit, in accordance with an operating temperature of the MOSFET, controls a voltage to be supplied to the body and adjusts, based on a relation between a body voltage and a gate voltage, a resistance value of a current flowing between the input terminal and the output terminal.

10 Claims, 14 Drawing Sheets

F I G. 5
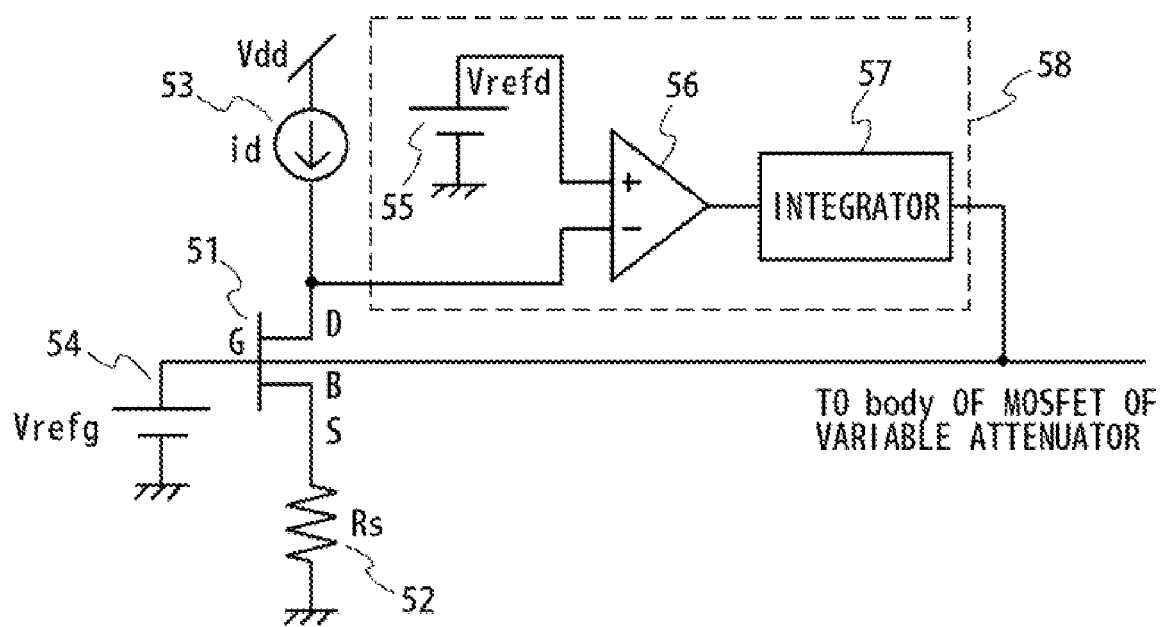

VARIABLE ATTENUATOR AND WIRELESS COMMUNICATION DEVICE

BACKGROUND OF THE INVENTION

1. Field of the Invention

The present invention relates to a variable attenuator used for the gain control of a radio-frequency signal, and particularly to a variable attenuator suitable for circuit integration applied to a wireless communication device and the like, and a wireless communication device.

2. Description of the Background Art

In recent years, mobile phones have progressed from second-generation mobile phones using a PDC system or a GSM system to third-generation mobile phones using a WCDMA system. In the WCDMA system, it is essential to control the output level of a transmitted signal from a terminal in accordance with the distance from a base station. In the current standards, it is necessary to control a transmission level of 80 dB.

An example of a wireless device using the WCDMA system will be described below. Specifically, the example is a wireless device using polar modulation. In the wireless device, a phase-modulated signal from baseband is inputted to a PLL, and the PLL controls a VCO. From the VCO, the phase-modulated signal having a frequency N times that of a carrier frequency is outputted, and the frequency is divided by N by a frequency divider. Normally, 2 or 4 is used as N. The output signal of the frequency divider is inputted to a power amplifier via a variable attenuator and an RF amplifier. To the power amplifier, an amplitude-modulated signal from baseband and an output level control signal are also inputted. In the power amplifier, amplitude modulation corresponding to the amplitude-modulated signal is superimposed on the phase-modulated signal inputted from the RF amplifier. As a result, the output signal is an amplitude-modulated and phase-modulated signal using QPSK modulation, 8PSK modulation, or the like. Further, the output level of the output signal is controlled by the power amplifier in accordance with the output level control signal. The output signal of the power amplifier is transmitted from an antenna via a duplexer.

As described above, output power is controlled by the power amplifier, but the variable range of the power amplifier is 30 to 40 dB at a maximum. Therefore, the variable attenuator is required to control an output range of 40 to 50 dB.

FIGS. 11 through 14 show examples (first through fourth examples) of conventional variable attenuators. FIG. 11 is a diagram showing the structure of a conventional variable attenuator 501 (the first example), disclosed in Japanese Patent Publication No. 3216808. Referring to FIG. 11, the conventional variable attenuator 501 uses a GaAsFET, of which the drain and the source are connected to a bias circuit 502 for temperature characteristics compensation (i.e., a temperature characteristics compensation circuit). FIG. 12 is a diagram showing the structure of a conventional variable attenuator 504 (the second example), disclosed in Japanese Patent Publication No. 3784664. Referring to FIG. 12, the conventional variable attenuator 504 controls the attenuation by changing the bias voltage in accordance with desired attenuation and also with the changes of the reflection coefficients with respect to the preceding and following circuits, with the use of a table stored in a ROM 506, a calculation circuit 505, and D/A converters 507a and 507b.

FIG. 13 is a diagram showing the structure of a conventional variable attenuator 508 (the third example), disclosed in Japanese Laid-Open Patent Publication No. 9-46175. Referring to FIG. 13, the conventional variable attenuator 508 uses a GaAsFET, of which the gate is connected to a temperature characteristics compensation circuit 509. FIG. 14 is a diagram showing the structure of a conventional variable attenuator 510 (the fourth example), disclosed in Japanese Laid-Open Patent Publication No. 2005-244877. Referring to FIG. 14, the conventional variable attenuator 510 uses a GaAsFET, of which the drain and the source are connected to a temperature characteristics compensation circuit 511, different from the type of circuit in FIG. 11.

FIG. 15 is a diagram illustrating a problem of the conventional variable attenuators. Referring to FIG. 15, the vertical axis represents the attenuation and the horizontal axis represents the number of stages of a variable attenuator. In FIG. 15, an upper solid line represents the minimum value of the attenuation and a lower solid line represents the maximum value of the attenuation, with respect to each stage of the variable attenuator. The difference between the minimum value and the maximum value is the variable range of the attenuation. As can be seen from FIG. 15, the larger the number of stages of the variable attenuator, the wider the variable range of the attenuation.

At the same time, the larger the number of stages of the variable attenuator, the larger the minimum value of the attenuation. The attenuation of the variable attenuator becomes noise. Particularly, the attenuation value when the attenuation is minimum satisfies the specification of receiving band noise of a wireless device, and therefore cannot be increased to more than a certain value. In a conventional wireless device, the specification of the attenuation value when the attenuation is minimum is enormous, i.e., more than 10 dB, since a filter is used between an RFIC and a power amplifier. However, this interstage filter is likely to be removed so as to miniaturize a wireless device. As a result, the specification of the attenuation value when the attenuation is minimum is required to be merely a few dB.

With the use of the conventional variable attenuators, a one-stage variable attenuator can obtain a variable range of the attenuation of merely 10 to 20 dB. To satisfy the specification of the attenuation value when the attenuation is maximum, four to five stages are required, since the variable range of the attenuation is not proportional to the number of stages. In this case, however, the attenuation value when the attenuation is minimum exceeds the specification at the same time. To improve this trade-off, it is necessary to increase the attenuation of a single-stage variable attenuator.

SUMMARY OF THE INVENTION

Therefore, an object of the present invention is to provide a variable attenuator for increasing the attenuation of a single-stage variable attenuator, and a wireless communication device.

To attain the above-mentioned object, according to an aspect of the present invention, a variable attenuator of the present invention includes: a MOSFET including a gate, a source, a drain, and a body; an attenuation control circuit for supplying a control voltage, obtained by inverting a polarity of a control voltage to be supplied to the gate and amplifying the result voltage by a predetermined amplification factor, to the source and the drain; and a temperature characteristics compensation circuit for, in accordance with an operating temperature of the MOSFET, controlling a voltage to be supplied to the body and adjusting, based on a relation between a body voltage and a gate voltage, a resistance value between the drain and the source.

According to the present aspect, it is possible to have temperature compensation of the variable attenuator, while maintaining the minimum value of the attenuation of the variable attenuator in a predetermined range and increasing the attenuation factor. Further, it is possible to reduce the number of stages of a multistage attenuator, used to obtain a high attenuation factor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a diagram showing an example of the structure of a temperature characteristics compensation circuit according to a third embodiment of the present invention;

DESCRIPTION OF THE PREFERRED EMBODIMENTS

First Embodiment

Figure 1A:
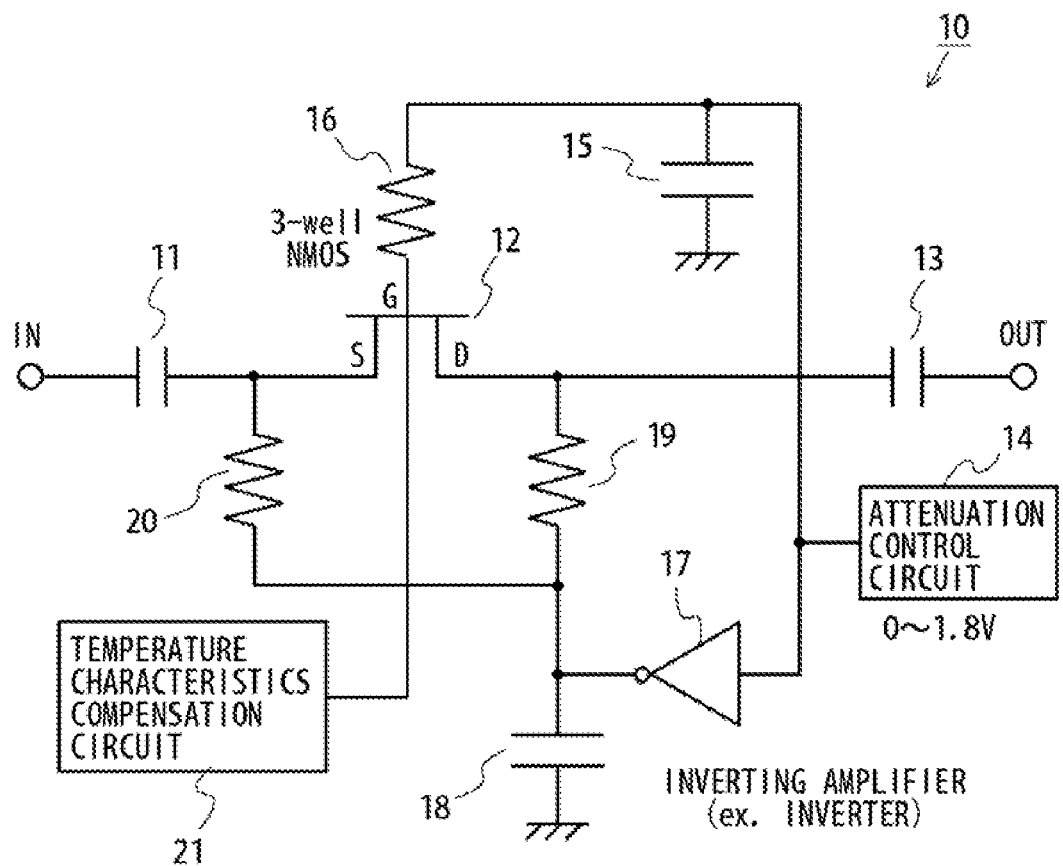
FIG. 1A is a diagram showing an example of the structure of a variable attenuator 10 according to a first embodiment of the present invention.

FIG. 1A is a diagram showing an example of the structure of a variable attenuator 10 according to a first embodiment of the present invention. Referring to FIG. 1A, an input signal is inputted to the source of a triple-well NMOS 12 via a DC blocking capacitor 11. The input signal is attenuated by the drain-source resistance of the triple-well NMOS 12 and outputted from the drain. The output signal is outputted to the following circuit (not shown) via a DC blocking capacitor 13.

Next, an attenuation control circuit 14 will be described. The attenuation of the variable attenuator 10 according to the present embodiment is adjusted by changing the gate voltage and the drain-source voltage of the triple-well NMOS 12. An output voltage of the attenuation control circuit 14 is supplied to the gate via a parallel-connected capacitor 15 and a series-connected resistor 16. The capacitor 15 is used to reduce the high-frequency noise from the attenuation control circuit 14, and the resistor 16 is used to reduce the leakage, from the gate to the attenuation control circuit 14, of the signal inputted to the source.

The output voltage of the attenuation control circuit 14 is also supplied to the drain and the source of the triple-well NMOS 12 via an inverting amplifier 17 and a parallel-connected capacitor 18, and also via series-connected resistors 19 and 20, respectively. Here, the inverting amplifier 17 inverts and outputs the output voltage of the attenuation control circuit 14. Due to this structure, it is possible to increase the voltage difference between the gate voltage and the drain-source voltage of the triple-well NMOS 12. Note, however, that there are limitations to increasing the voltage difference between the gate voltage and the drain-source voltage even if the output voltage to the drain and source is inverted with respect to the output voltage to the gate, since the voltage supplied to the gate and the voltage supplied to the drain and source are both the voltage outputted from the attenuation control circuit 14.

In response, a temperature characteristics compensation circuit 21 is connected to the body of the triple-well NMOS 12, thereby reducing the change of the attenuation, resulting from the change of the threshold of a MOSFET due to temperature. Since the voltage supplied to the body of the triple-well NMOS 12 is an output voltage from the temperature characteristics compensation circuit 21 and not the output voltage from the attenuation control circuit 14, it is possible, by changing the voltage supplied to the body, to increase the voltage difference between the gate voltage and the drain-source voltage.

In a conventional variable attenuator, the attenuation is changed by making only the gate voltage (or the drain voltage and the source voltage) of a FET variable, and thus temperature characteristics compensation is made by changing the drain voltage and the source voltage (or the gate voltage). However, since the attenuation depends on the difference between the gate voltage and the drain-source voltage, the conventional variable attenuator has limitations on the variable range of the attenuation. In the present invention, since it is possible to make both the gate voltage and the drain-source voltage variable by controlling the body voltage and thus making temperature characteristics compensation, a variable attenuator can have a wide variable range of the attenuation.

Next, the structure of the temperature characteristics compensation circuit 21 will be described. (Equation 1) shows the relation between the threshold voltage and the source-body voltage of a MOSFET.

$$V_{th} = V_{th0} + \gamma \cdot (\sqrt{2 \cdot \phi_F + V_S - V_B} - \sqrt{2 \cdot \phi_F})$$ [Equation 1]

In (Equation 1): $V_{th}$ is the threshold voltage; $V_S$ is the source voltage; $V_B$ is the body voltage; $V_{th0}$ is a threshold voltage when the source voltage and the body voltage are the same voltage; $\gamma$ is a coefficient; and $\phi_F$ is a Fermi level. To reduce the temperature dependence of the attenuation of the variable attenuator 10, it is only necessary that the threshold voltage $V_{th}$ be constant. That is, it is only necessary to increase the body voltage $V_B$ when $V_{th0}$ increases due to temperature change, and it is only necessary to reduce the body voltage $V_B$ when $V_{th0}$ decreases due to temperature change.

Figure 1B:
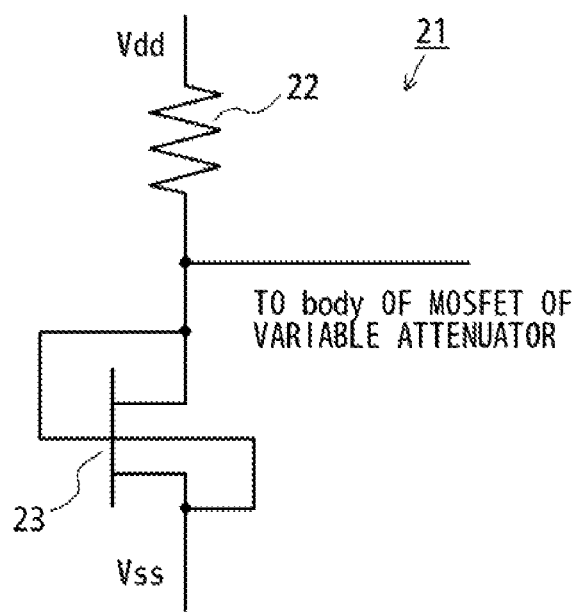
FIG. 1B is a diagram showing an example of the structure of a temperature characteristics compensation circuit 21 according to the first embodiment of the present invention.

FIG. 1B shows an example of the structure of the temperature characteristics compensation circuit 21. Referring to FIG. 1B, one end of a resistor 22 is connected to a drain-side reference voltage $V_{dd}$ and the other end is connected to the drain and the gate of a triple-well NMOS 23 of the temperature characteristics compensation circuit 21. Further, the source and the body of the triple-well NMOS 23 are connected to a source-side reference voltage $V_{SS}$. Thus, a voltage of the drain and the gate is supplied to the variable attenuator 10 as a temperature compensation voltage. Note that the source-side reference voltage $V_{SS}$ may be a negative voltage.

In the temperature characteristics compensation circuit 21 of FIG. 1B, the drain of the NMOS 23 is connected to the drain-side reference voltage $V_{dd}$, the source is connected to the source-side reference voltage $V_{SS}$, and also the source and the drain are connected to each other. Due to this structure, it is possible to detect, from the connecting point of the resistor 22 and the drain of the NMOS 23, the change of the threshold voltage $V_{th}$, resulting from the temperature change of the NMOS 23 of the temperature characteristics compensation circuit 21.

Note that the NMOS 12 of the variable attenuator 10 of FIG. 1A and the temperature characteristics compensation circuit 21 may be formed on the same substrate, whereby it is possible to make virtually the same the temperature change of the NMOS 12 of the variable attenuator 10 and that of the NMOS 23 of the temperature characteristics compensation circuit 21. Accordingly, the body voltage of the NMOS 12 of the variable attenuator 10 may be adjusted based on the change of the threshold voltage $V_{th}$, detected from the connecting point of the resistor 22 and the drain of the NMOS 23 that are included in the temperature characteristics compensation circuit 21, whereby it is possible to reduce the temperature dependence of the attenuation of the variable attenuator 10.

Figure 15:
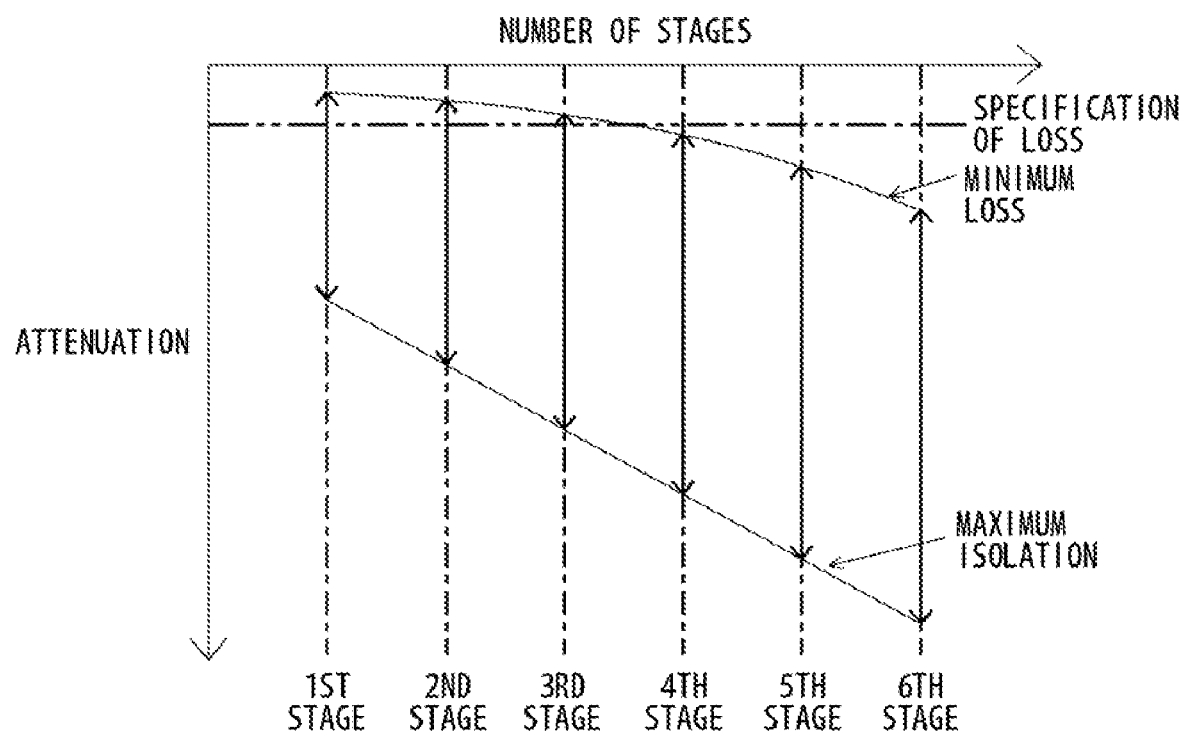
FIG. 15 is a diagram illustrating a problem of the conventional variable attenuators.

Next, the conventional variable attenuator and the variable attenuator 10 according to the first embodiment will be compared to each other. As shown in FIG. 15, the minimum attenuation and the maximum attenuation when the number of stages of each variable attenuator is increased, will be compared to each other.

Figure 2A:
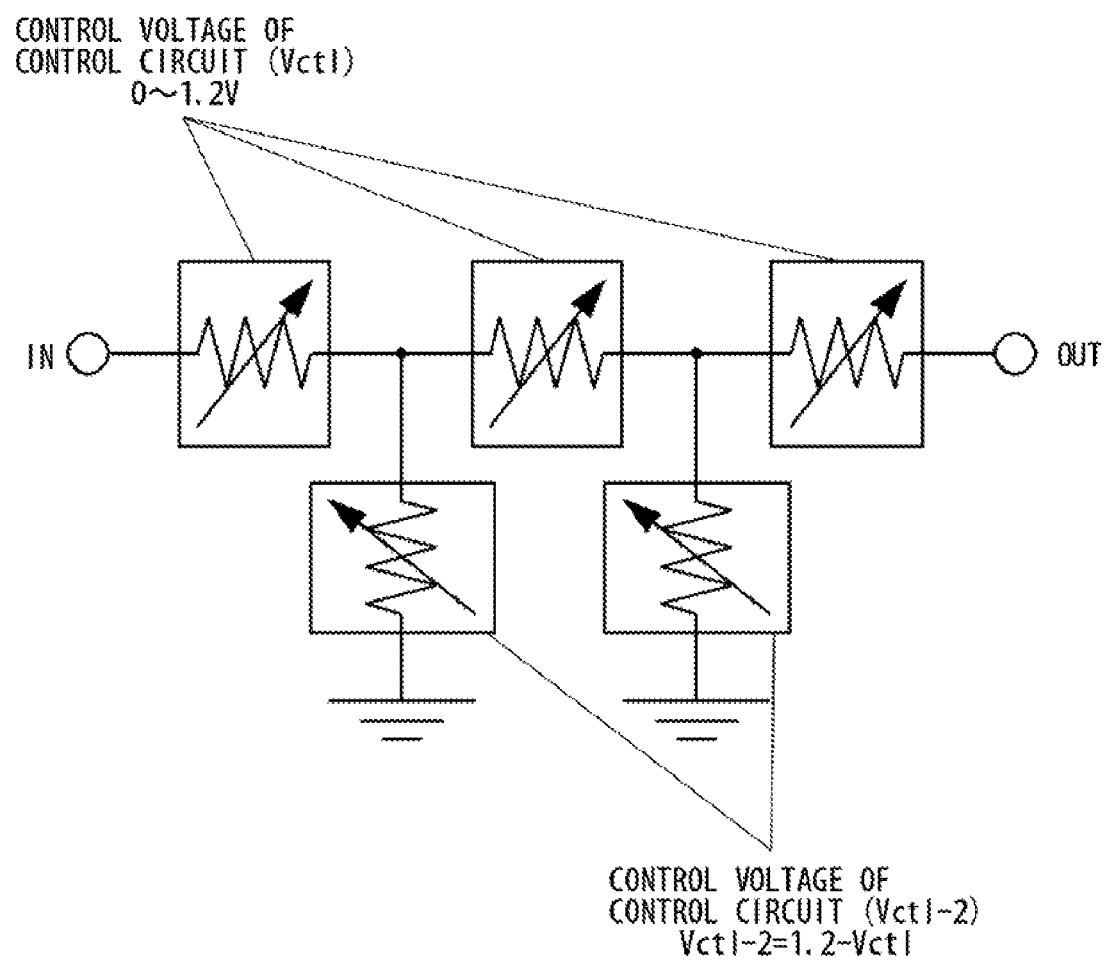
FIG. 2A is a diagram showing a multistage variable attenuator according to the first embodiment of the present invention.

FIG. 2A shows the structure of a five-stage variable attenuator. The five-stage variable attenuator of FIG. 2A includes the variable attenuators 10 of FIG. 1A, connected alternately in series and in parallel. The gate width of a MOSFET of each series-connected variable attenuator 10 is larger than the gate width of a MOSFET of each parallel-connected variable attenuator 10. The reason is to make the attenuation as small as possible when the attenuation is minimum. That is, when the attenuation is minimum, the resistance of the MOSFET of each series-connected variable attenuator 10 is minimum, and therefore the resistance value is required to be as small as possible. On the other hand, the resistance of the MOSFET of each parallel-connected variable attenuator 10 is maximum, and therefore the resistance is required to be as large as possible.

As for the control voltage of the attenuation control circuit of each variable attenuator 10, the value of the MOSFET of each series-connected variable attenuator 10 is $V_{ct1}$. $V_{ct1}$ is a value of 0 to 1.2 V. On the other hand, the value of the MOSFET of each parallel-connected variable attenuator is $V_{ct1-2}$. Here, $V_{ct1-2}$ is a value of $(1.2-V_{ct1})$ V.

Figure 2B:
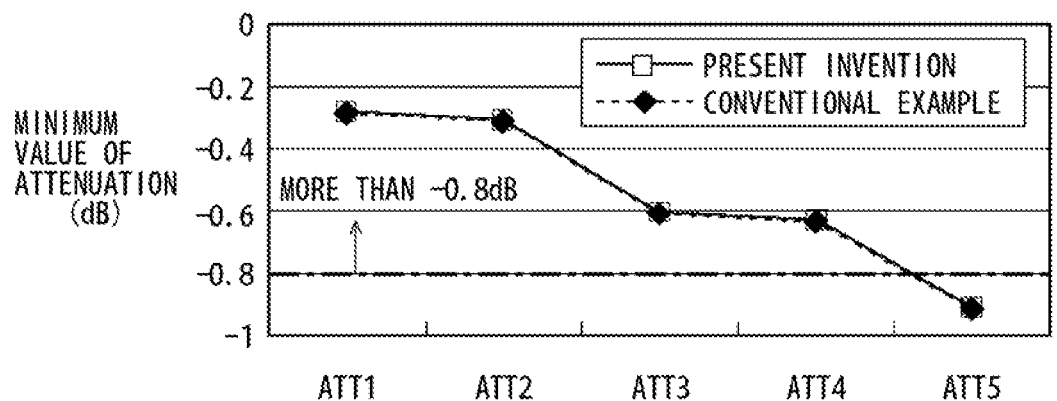
FIG. 2B is a diagram showing the relation between the number of stages and the minimum values of the attenuation.
Figure 13:
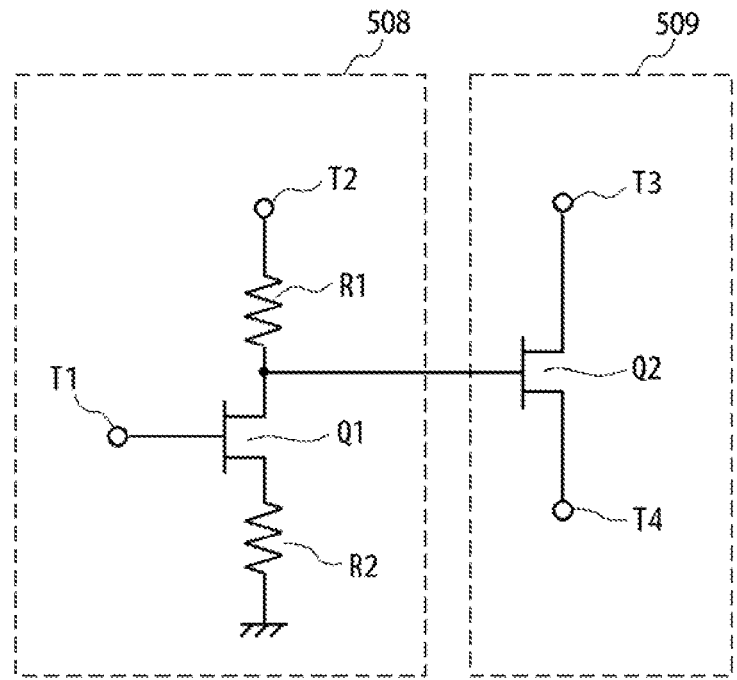
FIG. 13 is a diagram showing the structure of a conventional variable attenuator 508 (a third example)
Figure 14:
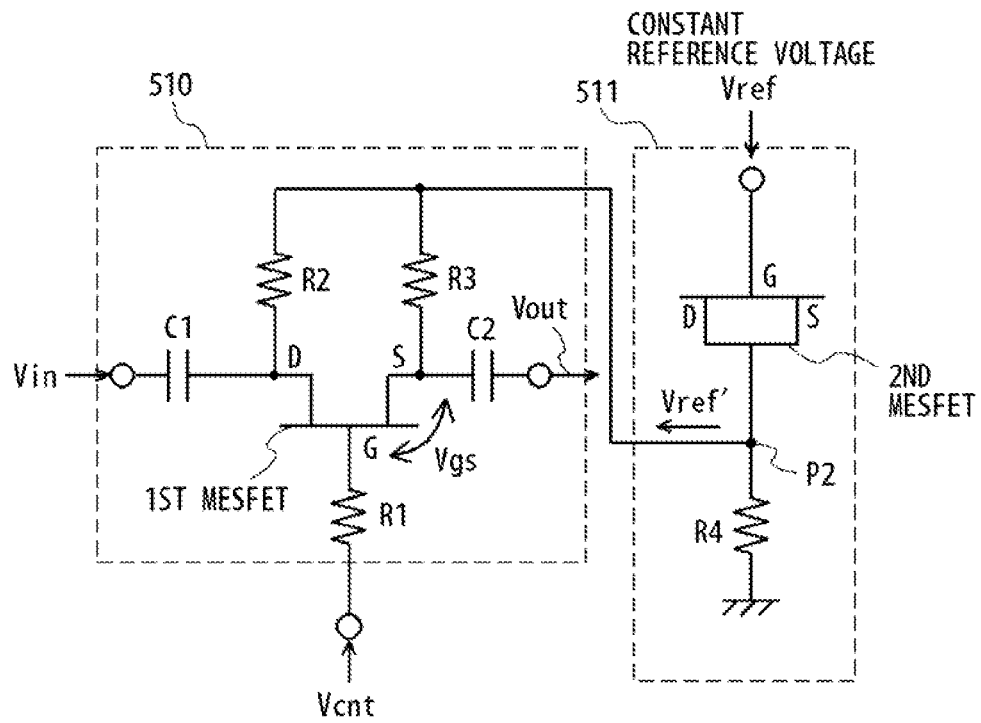
FIG. 14 is a diagram showing the structure of a conventional variable attenuator 510 (a fourth example)

FIG. 2B shows the minimum values of the attenuation when the number of stages of the variable attenuator is changed from one to five, and a comparison result between the case of the variable attenuators 10 according to the first embodiment and the case of the conventional variable attenuators, which do not have temperature characteristics compensation circuits, of FIG. 13, for example. Here, if the minimum value of the attenuation is required to be, for example, larger than $-0.8$ dB, it is necessary to design the number of stages to be equal to or less than four in both the cases of the variable attenuators 10 according to the present embodiment and the conventional variable attenuators. Note that in the figures, ATT represents the number of stages of the variable attenuator, and therefore ATT1, for example, indicates that the variable attenuator has one stage.

Figure 2C:
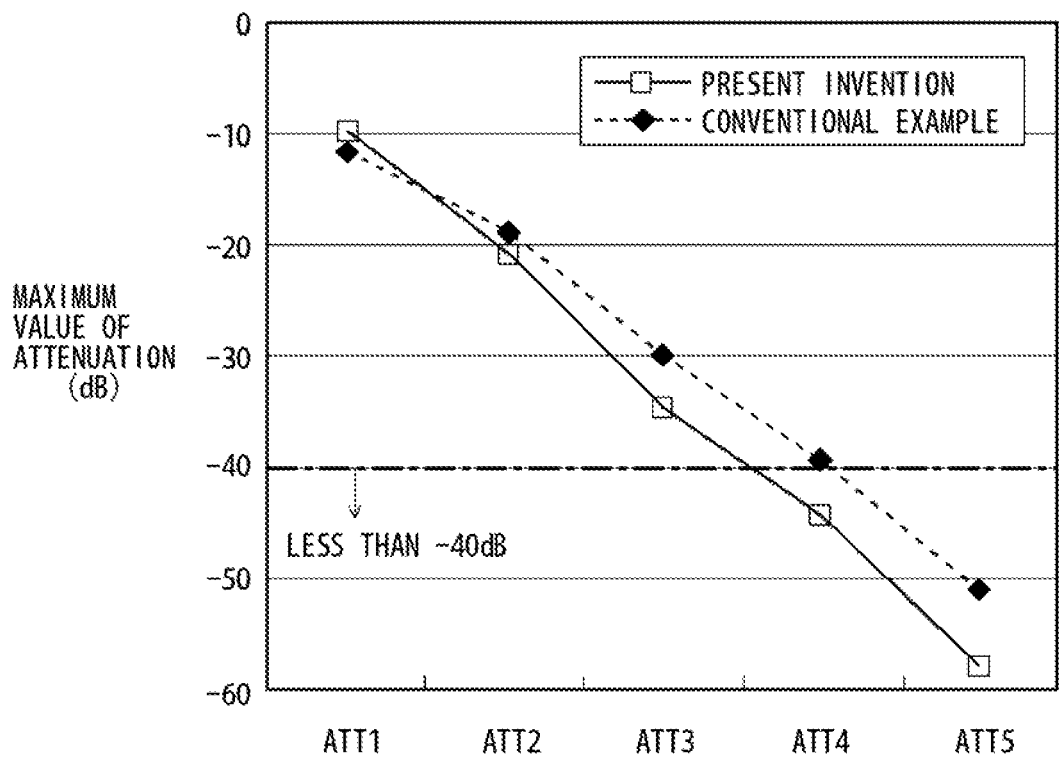
FIG. 2C is a diagram showing the relation between the number of stages and the maximum values of the attenuation.

FIG. 2C shows the maximum values of the attenuation when the number of stages of the variable attenuator is changed from one to five. Here, if the maximum value of the attenuation is required to be, for example, less than $-40$ dB, it is necessary to design the number of stages to be equal to or greater than four in the case of the variable attenuators 10 according to the present embodiment, and to be equal to or greater than five in the case of the conventional variable attenuators.

As can be seen from FIGS. 2B and 2C, a four-stage variable attenuator can satisfy desired specifications of the maximum value and the minimum value of the attenuation when using the variable attenuators 10 according to the present embodiment, but cannot satisfy both the desired specifications at the same time when using the conventional variable attenuators.

As described above, with the use of the variable attenuators 10 according to the first embodiment of the present invention, it is possible to obtain a wide variable range of the attenuation (e.g., that of 39.2 dB) by reducing the number of stages (e.g., one stage) of a variable attenuator without increasing the minimum value of the attenuation.

Second Embodiment

Figure 3:
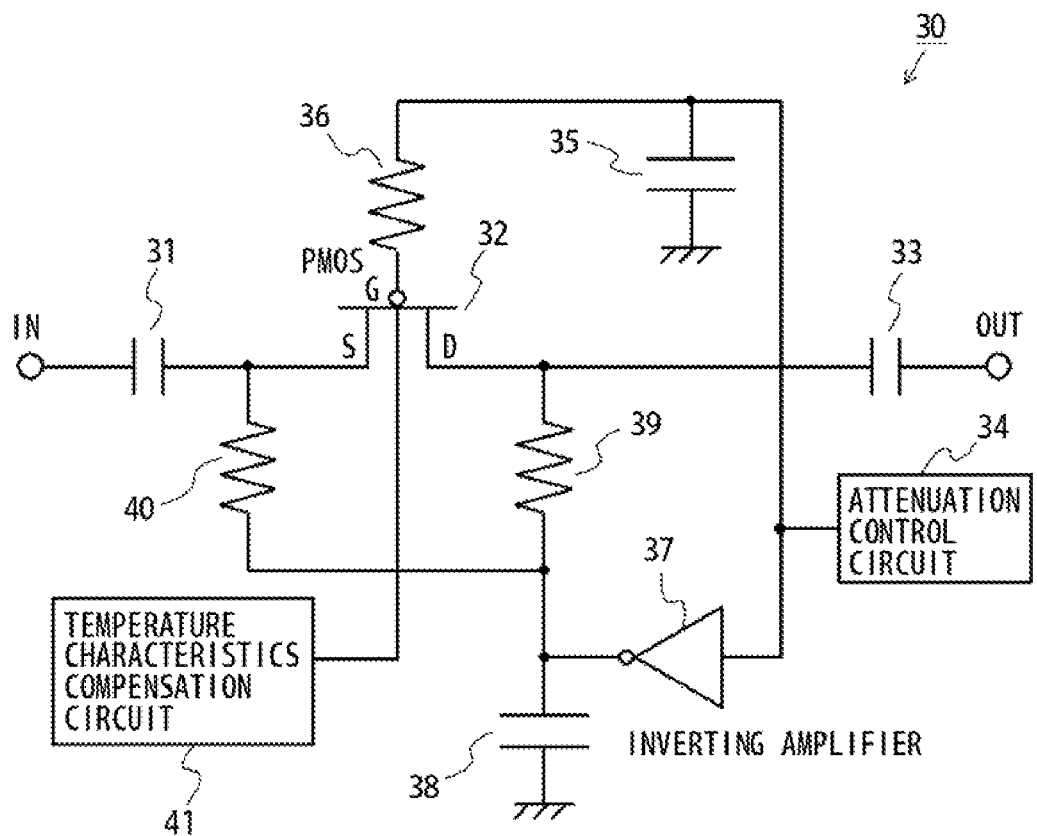
FIG. 3 is a diagram showing an example of the structure of a variable attenuator 30 according to a second embodiment of the present invention.

FIG. 3 shows an example of the structure of a variable attenuator 30 according to a second embodiment of the present invention. FIG. 3 is a diagram showing an example of the variable attenuator 30 using a triple-well PMOS. Referring to FIG. 3, an input signal is inputted to the source of a triple-well PMOS 32 via a DC blocking capacitor 31. The input signal is attenuated by the drain-source resistance of the triple-well PMOS 32 and outputted from the drain. The output signal is outputted to the following circuit (not shown) via a DC blocking capacitor 33.

Next, an attenuation control circuit 34 will be described. The attenuation of the variable attenuator 30 according to the present embodiment is adjusted by changing the gate voltage and the drain-source voltage of the triple-well PMOS 32. An output voltage of the attenuation control circuit 34 is supplied to the gate via a parallel-connected capacitor 35 and a series-connected resistor 36. The capacitor 35 is used to reduce the high-frequency noise from the attenuation control circuit 34, and the resistor 36 is used to reduce the leakage, from the gate to the attenuation control circuit 34, of the signal inputted to the source.

The output voltage of the attenuation control circuit 34 is also supplied to the drain and the source of the triple-well PMOS 32 via an inverting amplifier 37 and a parallel-connected capacitor 38, and also via series-connected resistors 39 and 40, respectively. Here, the inverting amplifier 37 inverts and outputs the output voltage of the attenuation control circuit 34. Due to this structure, it is possible to increase the voltage difference between the gate voltage and the drain-source voltage of the triple-well PMOS 32. Note, however, that there are limitations to increasing the voltage difference between the gate voltage and the drain-source voltage even if the output voltage to the drain and source is inverted with the output voltage to the gate, since the voltage supplied to the gate and the voltage supplied to the drain and source are both the voltage outputted from the attenuation control circuit 34.

In response, similarly to the first embodiment, a temperature characteristics compensation circuit 41 is connected to the body of the triple-well PMOS 32, thereby reducing the change of the attenuation, resulting from the change of the threshold of a MOSFET due to temperature. Since the voltage supplied to the body is an output voltage from the temperature characteristics compensation circuit 41 and not the output voltage from the attenuation control circuit 34, it is possible, by changing the voltage supplied to the body, to increase the voltage difference between the gate voltage and the drain-source voltage.

As described in the first embodiment, it is possible to represent the relation between the threshold voltage and the source-body voltage of a MOSFET by (Equation 1), using the threshold voltage $V_{th}$, the source voltage $V_S$, the body voltage $V_B$, the threshold voltage $V_{th0}$ when the source voltage and the body voltage are the same voltage, the coefficient $\gamma$, and the Fermi level $\phi_F$. Similarly to the first embodiment, to reduce the temperature dependence of the attenuation of the variable attenuator 30, it is only necessary that the threshold voltage $V_{th}$ be constant. That is, it is only necessary to increase the body voltage $V_B$ when $V_{th0}$ increases due to temperature change, and it is only necessary to reduce the body voltage $V_B$ when $V_{th0}$ decreases due to temperature change.

Figure 4:
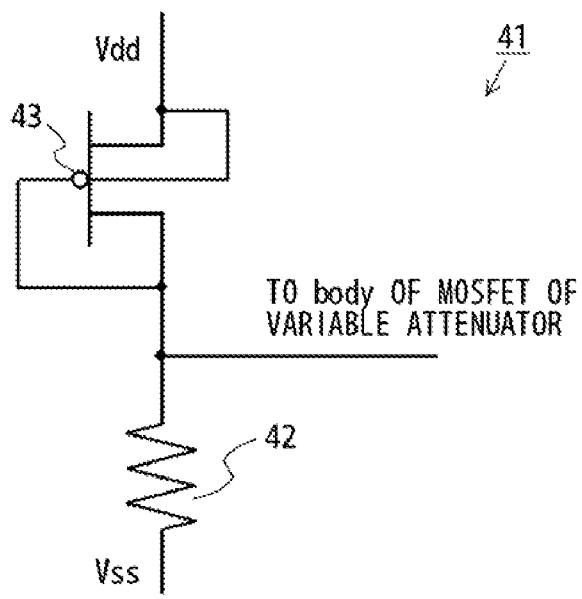
FIG. 4 is a diagram showing an example of the structure of a temperature characteristics compensation circuit 41 according to the second embodiment of the present invention.

FIG. 4 shows an example of the structure of the temperature characteristics compensation circuit 41. Referring to FIG. 4, one end of a resistor 42 is connected to a source-side reference voltage $V_{SS}$ and the other end is connected to the source and the gate of a triple-well PMOS 43. Further, the drain and the body of the triple-well PMOS 43 are connected to a drain-side reference voltage $V_{dd}$. Thus, a voltage of the source and the gate is supplied to the variable attenuator 30 as a temperature compensation voltage. Note that the drain-side reference voltage $V_{dd}$ may be higher than the power supply voltage of an IC having mounted thereon the variable attenuator 30 according to the present embodiment.

In the temperature characteristics compensation circuit 41 of FIG. 4, the drain of the PMOS 43 is connected to the drain-side reference voltage $V_{dd}$, the source is connected to the source-side reference voltage $V_{SS}$, and also the source and the drain are connected to each other. Due to this structure, it is possible to detect, from the connecting point of the resistor 42 and the source of the PMOS 43, the change of the threshold voltage $V_{th}$, resulting from the temperature change of the PMOS 43 of the temperature characteristics compensation circuit 41.

The PMOS 32 of the variable attenuator 30 of FIG. 3 and the temperature characteristics compensation circuit 41 may be formed on the same substrate, whereby it is possible to make virtually the same the temperature change of the PMOS 32 of the variable attenuator 30 and that of the PMOS 43 of the temperature characteristics compensation circuit 41. Accordingly, the body voltage of the PMOS 32 of the variable attenuator 30 may be adjusted based on the change of the threshold voltage $V_{th}$, detected from the connecting point of the resistor 42 and the source of the PMOS 43 that are included in the temperature characteristics compensation circuit 41, whereby it is possible to reduce the temperature dependence of the attenuation of the variable attenuator 30.

Based on the variable attenuator 30 according to the second embodiment, it is possible to reduce the temperature dependence of the attenuation. Therefore, similarly to the first embodiment, a fewer-stage variable attenuator can satisfy desired specifications of the maximum value and the minimum value of the attenuation when using the variable attenuators 30 according to the second embodiment. Consequently, with the use of the variable attenuators 30 according to the second embodiment, it is possible to obtain a wide variable range of the attenuation by reducing the number of stages of a multistage variable attenuator without increasing the minimum value of the attenuation.

Third Embodiment

FIG. 5 is another example of the structure of the temperature characteristics compensation circuit used for the variable attenuator 10 according to the first embodiment. Referring to FIG. 5, the source of a triple-well NMOS 51 is connected to ground via a resistor 52. Further, the drain of the NMOS 51 is connected to a constant-current source 53, such that a drain current $i_d$ is maintained constant. The gate of the NMOS 51 is connected to a constant-voltage source 54, such that a gate voltage $V_{refg}$ is maintained constant.

One end of the resistor 52 is connected to a source-side reference voltage $V_{SS}$ and the other end is connected to the source and the gate of the triple-well NMOS 51. Further, the drain and the body of the triple-well NMOS 51 are connected to a drain-side reference voltage $V_{dd}$. Thus, a voltage of the source and the gate is supplied to the variable attenuator 10 as a temperature compensation voltage.

Due to this structure, in the temperature characteristics compensation circuit of FIG. 5, the gate voltage $V_{refg}$, the drain current $i_d$, and a source voltage $i_d/R_s$ are all constant. Here, $R_S$ is the resistance value of the resistor 52. The temperature characteristics compensation circuit according to the third embodiment further includes a feedback circuit 58 having a constant-voltage source $V_{refd}$ 55, a comparator 56, and an integrator 57. One input of the comparator 56 is connected to the constant-voltage source $V_{refd}$ 55 and the other input of the comparator 56 is connected to the connecting point of the drain of the NMOS 51 and the constant-current source 53. Further, the output of the integrator 57 is connected to the body of the NMOS 51. Due to this structure, the gate voltage $V_{refg}$, the drain current $i_d$, and the source voltage $i_d/R_s$ of the NMOS 51 are all constant. Note that $V_{refg}$, $V_{refd}$, and $i_d$ can be supplied from a circuit for which temperature characteristics compensation has been made, such as a bandgap regulator (not shown).

Here, a body voltage $V_B$ when the threshold voltage $V_{th}$ is constant can be measured as a body voltage $V_B$ when a predetermined drain current $i_d$ is caused to flow with the gate voltage, the drain voltage, and the source voltage, all fixed at predetermined values. That is, from (Equation 1), when the source voltage $V_S$ and the body voltage $V_B$ are each a constant voltage, the threshold voltage $V_{th}$ and the source voltage $V_S$ may be made constant, whereby it is possible to monitor the change of the body voltage $V_B$, caused in accordance with the change of the threshold voltage $V_{th0}$ resulting from temperature change.

In the temperature characteristics compensation circuit of FIG. 5, the integrator 57 outputs the body voltage $V_B$, which changes in accordance with the change of the threshold voltage $V_{th0}$ resulting from temperature change. Accordingly, it is possible to make temperature characteristics compensation with higher accuracy by applying this outputted body voltage $V_B$ as the body voltage of the NMOS 12 of the variable attenuator 10 according to the first embodiment.

Figure 6:
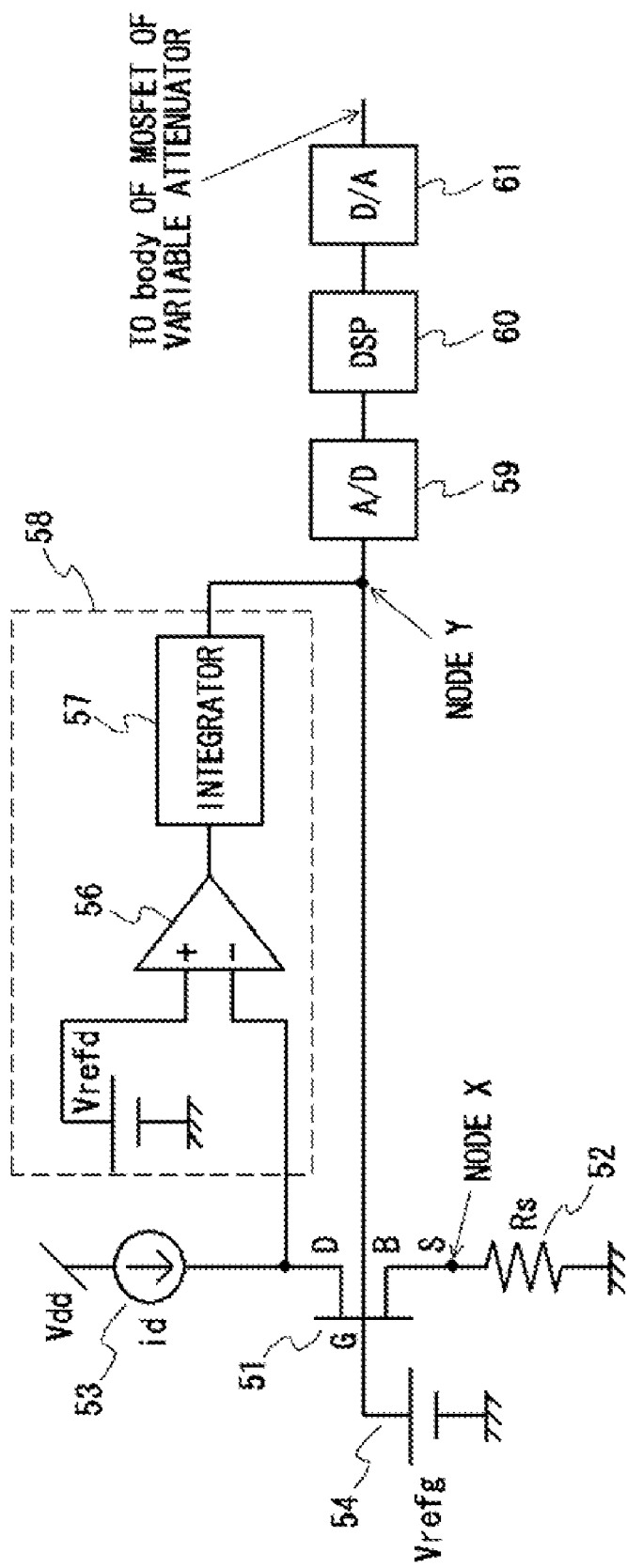
FIG. 6 is a diagram showing another example of the structure of the temperature characteristics compensation circuit according to the third embodiment of the present invention.

FIG. 6 is yet another example of the structure of the temperature characteristics compensation circuit used for the variable attenuator 10 according to the first embodiment. Referring to FIG. 6, from (Equation 1), the threshold voltage $V_{th}$ varies depending on the source voltage $V_S$. Therefore, it is preferable to fine-tune the temperature characteristics compensation voltage value of the body voltage $V_B$ in accordance with the source voltage of the MOSFET of the variable attenuator 10. From (Equation 1), (Equation 2) holds true.

$$V_{th}(V_{SX}) = V_{th0}(T_0) + \gamma \cdot \{\sqrt{2\phi_F + V_{SX} - V_{BY}(T_0)} - \sqrt{2\phi_F}\}$$

$$V_{th}(V_{SX}) = V_{th0}(T) + \gamma \cdot \{\sqrt{2\phi_F + V_{SX} - V_{BY}(T)} - \sqrt{2\phi_F}\}$$

$$V_{th}(V_{SA}) = V_{th0}(T_0) + \gamma \cdot \{\sqrt{2\phi_F + V_{SA} - V_{BA}(T_0)} - \sqrt{2\phi_F}\}$$

$$V_{th}(V_{SA}) = V_{th0}(T) + \gamma \cdot \{\sqrt{2\phi_F + V_{SA} - V_{BA}(T)} - \sqrt{2\phi_F}\} \quad \text{[Equation 2]}$$

Here, $V_{SX}$ is the voltage of a node X, $V_{BY}$ is the voltage of a node Y, and $T_0$ and $V_{BA}$ are the voltage applied to the body of the MOSFET of the variable attenuator 10. From (Equation 2), (Equation 3) holds true.

$$\sqrt{2\phi_f + V_{SX} - V_{BY}(T)} - \sqrt{2\phi_f + V_{SX} - V_{BY}(T_0)} = \sqrt{2\phi_f + V_{SA} - V_{BA}(T)} - \sqrt{2\phi_f + V_{SA} - V_{BA}(T_0)} \quad \text{[Equation 3]}$$

In (Equation 3), $\phi_F$ is a physical constant, $V_{SX}$ is the control voltage of the variable attenuator 10, and $V_{BY}(T)$ is the output voltage of the temperature characteristics compensation circuit. $V_{SX}$ and $V_{BY}(T_0) = V_{BA}(T_0)$ are known in advance when the variable attenuator 10 and the temperature characteristics compensation circuit are designed. Therefore, it is possible to calculate the voltage $V_{BA}(T)$ to be applied to the body of the MOSFET of the variable attenuator 10. An A/D converter 59 converts the output voltage $V_{BY}(T)$ of the temperature characteristics compensation circuit into a digital signal, a DSP 60 calculates $V_{BA}(T)$, and a D/A converter 61 converts the calculation result into an analog signal and supplies the conversion result to the MOSFET of the variable attenuator 10. Due to this structure, it is possible to provide a high-accuracy temperature characteristics compensation circuit.

Fourth Embodiment

Figure 7:
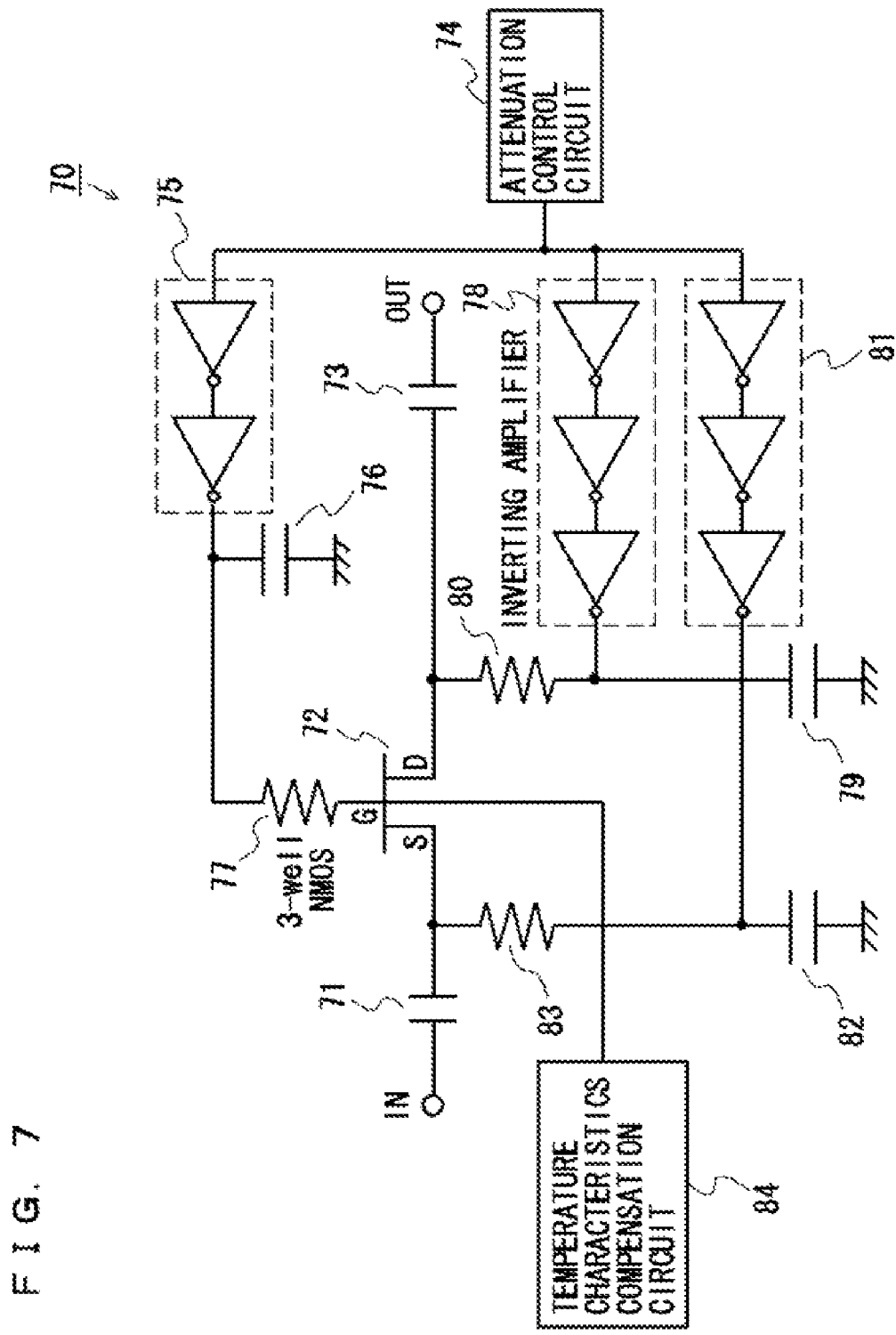
FIG. 7 is a diagram showing an example of the structure of a variable attenuator 70 according to a fourth embodiment of the present invention.

FIG. 7 shows an example of the structure of a variable attenuator 70 according to a fourth embodiment of the present invention. Referring to FIG. 7, an input signal is inputted to the source of a triple-well NMOS 72 via a DC blocking capacitor 71. The input signal is attenuated by the drain-source resistance of the triple-well NMOS 72 and outputted from the drain. The output signal is outputted to the following circuit (not shown) via a DC blocking capacitor 73.

Next, an attenuation control circuit 74 will be described. The attenuation of the variable attenuator 70 according to the present embodiment is adjusted by changing the gate voltage and the drain-source voltage of the triple-well NMOS 72. An output voltage of the attenuation control circuit 74 is supplied to the gate via an inverting amplifier 75, a parallel-connected capacitor 76, and a series-connected resistor 77. The inverting amplifier 75 inverts and outputs the output voltage of the attenuation control circuit 74. The capacitor 76 is used to reduce the high-frequency noise from the attenuation control circuit 74, and the resistor 77 is used to reduce the leakage, from the gate to the attenuation control circuit 74, of the signal inputted to the source.

The output voltage of the attenuation control circuit 74 is also supplied to the drain of the triple-well NMOS 72 via an inverting amplifier 78, a parallel-connected capacitor 79, and a series-connected resistor 80. Here, the inverting amplifier 78 inverts and outputs the output voltage of the attenuation control circuit 74. Further, the output voltage of the attenuation control circuit 74 is also supplied to the source of the triple-well NMOS 72 via an inverting amplifier 81, a parallel-connected capacitor 82, and a series-connected resistor 83. Here, the inverting amplifier 81 inverts and outputs the output voltage of the attenuation control circuit 74.

As described above, in the fourth embodiment, the control voltages of the gate, the drain, and the source of the NMOS 72 are supplied via the independent inverting amplifiers 75, 78, and 81, respectively. Due to this structure, it is possible to secure the isolation between the gate and the drain, the isolation between the gate and the source, and the isolation between the source and the drain, of the NMOS 72.

When the attenuation is maximum, it is necessary to secure an isolation of up to approximately 45 to 55 dB, between the source and the drain. Since it is impossible to satisfy this specification if signals leak through the control lines of the gate voltage, the drain voltage, and the source voltage, it is very important to obtain the isolation between the control line of the drain and the control line of the source. In the fourth embodiment, it is possible to reduce the signal leakage through the control lines, and therefore it can be expected to improve the isolation between the source and the drain.

Note that the body voltage of the NMOS 72 maybe controlled by applying any one of the temperature characteristics compensation circuits, described in the first through third embodiments, to a temperature characteristics compensation circuit 84, whereby it can be expected that a fewer-stage variable attenuator satisfies desired specifications of the maximum value and the minimum value of the attenuation. Further, it can also be expected to obtain a wide variable range of the attenuation without increasing the minimum value of the attenuation.

Fifth Embodiment

Figure 8:
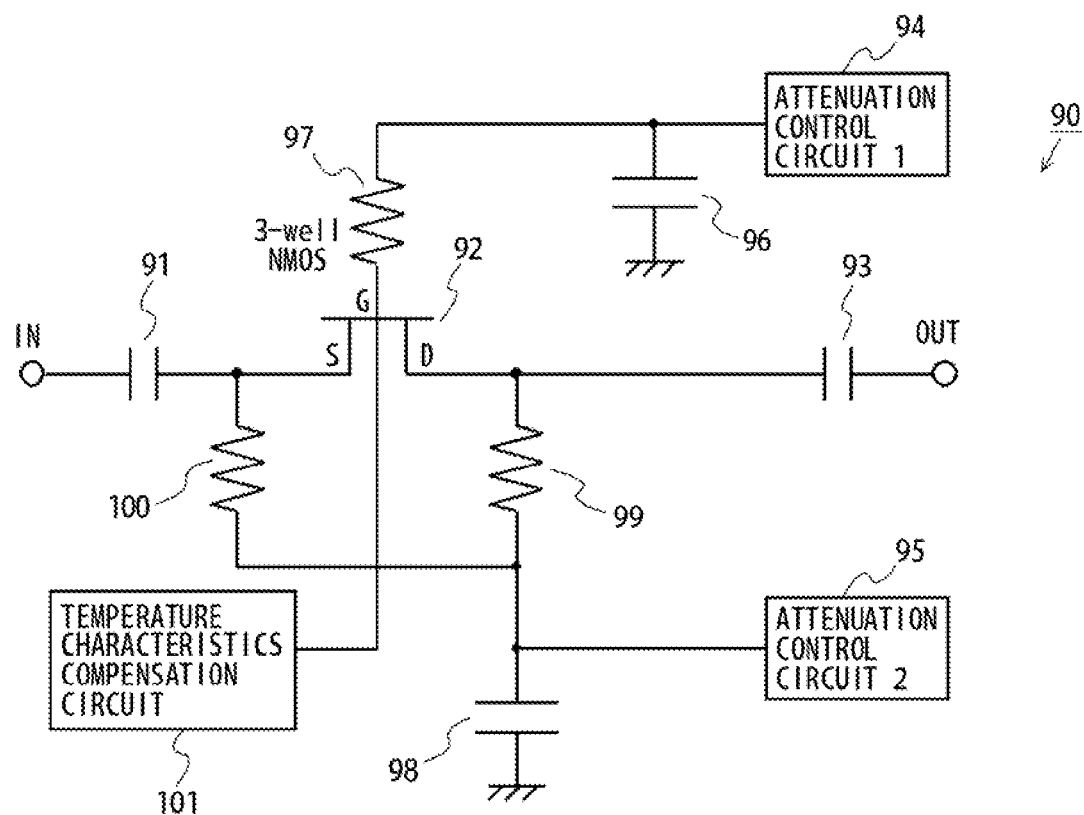
FIG. 8 is a diagram showing an example of the structure of a variable attenuator 90 according to a fifth embodiment of the present invention.

FIG. 8 is an example of the structure of a variable attenuator 90 according to a fifth embodiment of the present invention. Referring to FIG. 8, an input signal is inputted to the source of a triple-well NMOS 92 via a DC blocking capacitor 91. The input signal is attenuated by the drain-source resistance of the triple-well NMOS 92 and outputted from the drain. The output signal is outputted to the following circuit (not shown) via a DC blocking capacitor 93.

Next, a first attenuation control circuit 94 and a second attenuation control circuit 95 will be described. The attenuation of the variable attenuator 90 according to the present embodiment is adjusted by changing the gate voltage and the drain-source voltage of the triple-well NMOS 92. An output voltage of the first attenuation control circuit 94 is supplied to the gate of the NMOS 92 via a parallel-connected capacitor 96 and a series-connected resistor 97. The capacitor 96 is used to reduce the high-frequency noise from the first attenuation control circuit 94, and the resistor 97 is used to reduce the leakage, from the gate to the first attenuation control circuit 94, of the signal inputted to the source. Further, An output voltage of the second attenuation control circuit 95 is supplied to the drain and the source of the triple-well NMOS 92 via a parallel-connected capacitor 98, and also via series-connected resistors 99 and 100, respectively.

As described above, in the fifth embodiment, the control voltage of the gate and the control voltage of the drain and source are supplied from the first and second attenuation control circuits 94 and 95, different from each other, respectively. Due to this structure, it is possible to secure the isolation between the gate and the drain, the isolation between the gate and the source, and the isolation between the source and the drain, of the NMOS 92.

When the attenuation is maximum, it is necessary to secure an isolation of up to approximately 45 to 55 dB, between the source and the drain. Since it is impossible to satisfy this specification if signals leak through the control lines of the gate voltage, the drain voltage, and the source voltage, it is very important to obtain the isolation between the control line of the drain and the control line of the source.

Generally, the change of attenuation with respect to the gate voltage and the change of attenuation with respect to the drain-source voltage are different in characteristics from each other. Therefore, to control the attenuation with higher accuracy, it is effective that control circuits are separately provided for the gate voltage and the drain-source voltage. Further, as with the first and second attenuation control circuits 94 and 95, the control circuits may be separate from each other, whereby it can be expected to improve the isolation between the gate and the drain and source.

Note that the body voltage of the NMOS 92 may be controlled by applying any one of the temperature characteristics compensation circuits, described in the first through third embodiments, to a temperature characteristics compensation circuit 101, whereby it can be expected that a fewer-stage variable attenuator satisfies desired specifications of the maximum value and the minimum value of the attenuation. Further, it can also be expected to obtain a wide variable range of the attenuation without increasing the minimum value of the attenuation.

Sixth Embodiment

Figure 9A:
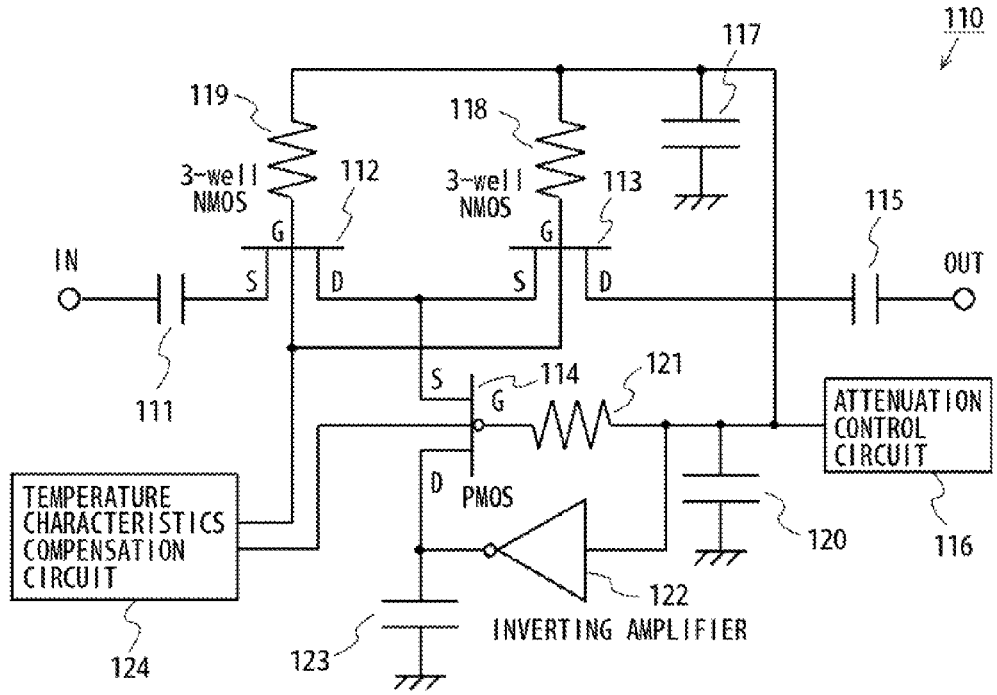
FIG. 9A is a diagram showing an example of the structure of a variable attenuator 110 according to a sixth embodiment of the present invention.

FIG. 9A is a diagram showing an example of the structure of a variable attenuator 110 according to a sixth embodiment of the present invention. The variable attenuator 110 of FIG. 9A is an example of a variable attenuator having NMOSs and a PMOS connected alternately in a three-stage manner. Specifically, in the variable attenuator 110, two triple-well NMOSs 112 and 113 are connected to each other in series. To the connecting point of the drain of the NMOS 112 and the source of the NMOS 113, the control voltage is supplied from a PMOS 114, connected to these two NMOSs in parallel. An input terminal is connected to the source of the NMOS 112 via a capacitor 111. The drain of the NMOS 112 is connected to the source of the NMOS 113 and the source of the PMOS 114. The drain of the NMOS 113 is connected to an output terminal via a capacitor 115.

To the gates of the NMOS 112 and the NMOS 113, an output voltage of an attenuation control circuit 116 is inputted via a parallel-connected capacitor 117, and also via series-connected resistors 119 and 118, respectively. The capacitor 117 is connected between a signal line and ground, so as to reduce the high-frequency noise from the attenuation control circuit 116. Further, the resistors 119 and 118 are used to reduce the leakage, from the respective gates to the attenuation control circuit 116, of the signals inputted to the sources of the NMOS 112 and the NMOS 113, respectively.

On the other hand, to the gate of the PMOS 114, the output voltage of the attenuation control circuit 116 is inputted via a parallel-connected capacitor 120 and a series-connected resistor 121. The capacitor 120 is connected between a signal line and ground, so as to reduce the high-frequency noise from the attenuation control circuit 116. Further, the resistor 121 is used to reduce the leakage, from the gate to the attenuation control circuit 116, of the signal inputted to the source of the PMOS 114.

Further, to the drain of the PMOS 114, a signal from an inverting amplifier 122 is inputted. The inverting amplifier 122 inverts and outputs the output voltage of the attenuation control circuit 116. Furthermore, a capacitor 123 is connected between the drain of the PMOS 114 and ground, so as to high-frequency-ground the connected drain.

The operation of the variable attenuator 110 according to the present embodiment will be described. The case shown is where the attenuation of the variable attenuator 110 is minimum. A HIGH voltage is applied from the attenuation control circuit 116 to the gates of the NMOS 112 and the NMOS 113, and the resistance value between the drain and the source of each of the NMOS 112 and the NMOS 113 is minimized. On the other hand, the HIGH voltage is also applied to the gate of the PMOS 114, and the resistance value of the PMOS 114 is maximized. Due to this structure, the attenuation of the variable attenuator 110 is minimized. Further, in this structure, a LOW voltage is applied to the drain of the PMOS 114. Consequently, it is possible to obtain a larger resistance value between the drain and the source of the PMOS 114 than that obtained when simply applying the HIGH voltage to the gate of the PMOS 114, and therefore the attenuation of the variable attenuator 110 becomes smaller.

Next, the case shown is where the attenuation of the variable attenuator 110 is maximum. A LOW voltage is applied from the attenuation control circuit 116 to the gates of the NMOS 112 and the NMOS 113, and the resistance value between the drain and the source of each of the NMOS 112 and the NMOS 113 is maximized. On the other hand, the LOW voltage is also applied to the gate of the PMOS 114, and the resistance value of the PMOS 114 is minimized. Due to this structure, the attenuation of the variable attenuator 110 is maximized. Further, in this structure, a HIGH voltage is applied to the drain of the PMOS 114. At this time, a HIGH voltage is applied to the source of the NMOS 112 and the drain of the NMOS 113. Consequently, it is possible to obtain a larger resistance value between the drain and the source of each of the NMOS 112 and the NMOS 113 than that obtained when simply applying the LOW voltage to the gates of the NMOS 112 and the NMOS 113, and therefore the attenuation of the variable attenuator 110 becomes larger.

As described above, the variable attenuator 110 according to the present embodiment can be expected to widen the variable range of the attenuation. Further, the variable attenuator 110 according to the present embodiment can reduce the number of resistors of a control line and of a bias circuit. Therefore, it is possible to reduce chip area and it can be expected to reduce degradation, through a control line, of isolation between input and output.

Note that the body voltages of the NMOS 112, the NMOS 113, and the PMOS 114 may be controlled by applying any one of the temperature characteristics compensation circuits, described in the first through third embodiments, to a temperature characteristics compensation circuit 124, whereby it can be expected that a fewer-stage variable attenuator satisfies desired specifications of the maximum value and the minimum value of the attenuation. Further, it can also be expected to obtain a wide variable range of the attenuation without increasing the minimum value of the attenuation.

Figure 9B:
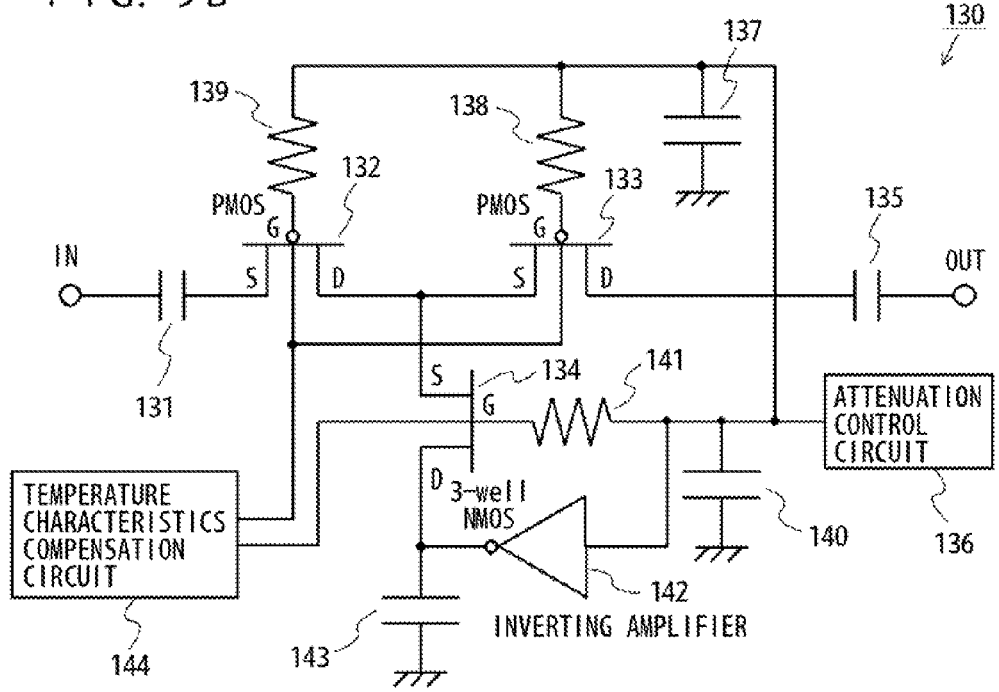
FIG. 9B is a diagram showing an example of the structure of a variable attenuator 130 according to the sixth embodiment of the present invention.

FIG. 9B shows an example of the structure of a variable attenuator 130, obtained by switching the NMOSs and the PMOS of FIG. 9A. In the variable attenuator 130 of FIG. 9B, two triple-well PMOSs 132 and 133 are connected to each other in series. To the connecting point of the drain of the PMOS 132 and the source of the PMOS 133, the control voltage is supplied from an NMOS 134, connected to these two PMOSs in parallel. An input terminal is connected to the source of the PMOS 132 via a capacitor 131. The drain of the PMOS 132 is connected to the source of the PMOS 133 and the source of the NMOS 134. The drain of the PMOS 133 is connected to an output terminal via a capacitor 135.

To the gates of the PMOS 132 and the PMOS 133, an output voltage of an attenuation control circuit 136 is inputted via a parallel-connected capacitor 137, and also via series-connected resistors 139 and 138, respectively. The capacitor 137 is connected between a signal line and ground, so as to reduce the high-frequency noise from the attenuation control circuit 136. Further, the resistors 139 and 138 are used to reduce the leakage, from the respective gates to the attenuation control circuit 136, of the signals inputted to the sources of the PMOS 132 and the PMOS 133, respectively.

On the other hand, to the gate of the NMOS 134, the output voltage of the attenuation control circuit 136 is inputted via a parallel-connected capacitor 140 and a series-connected resistor 141. The capacitor 140 is connected between a signal line and ground, so as to reduce the high-frequency noise from the attenuation control circuit 136. Further, the resistor 141 is used to reduce the leakage, from the gate to the attenuation control circuit 136, of the signal inputted to the source of the NMOS 134.

Further, to the drain of the NMOS 134, a signal from an inverting amplifier 142 is inputted. The inverting amplifier 142 inverts and outputs the output voltage of the attenuation control circuit 136. Furthermore, a capacitor 143 is connected between the drain of the NMOS 134 and ground, so as to high-frequency-ground the connected drain.

The operation of the variable attenuator 130 of FIG. 9B is similar to that of the variable attenuator 110 of FIG. 9A, except that the polarities of the voltages are reversed. As described above, the variable attenuator 130, which is a modification of the present embodiment, can be expected to widen the variable range of the attenuation.

Further, the variable attenuator 130, which is a modification of the present embodiment, can reduce the number of resistors of a control line and of a bias circuit. Therefore, it is possible to reduce chip area and it can be expected to reduce degradation, through a control line, of isolation between input and output.

Note that the body voltages of the PMOS 132, the PMOS 133, and the NMOS 134 may be controlled by applying any one of the temperature characteristics compensation circuits, described in the first through third embodiments, to a temperature characteristics compensation circuit 144, whereby it can be expected that a fewer-stage variable attenuator satisfies desired specifications of the maximum value and the minimum value of the attenuation. Further, it can also be expected to obtain a wide variable range of the attenuation without increasing the minimum value of the attenuation.

Further, the variable attenuator 110 of FIG. 9A and the variable attenuator 130 of FIG. 9B may be connected to each other in parallel, whereby it can be expected to provide a variable attenuator capable of suppressing the occurrence of distortion even when an input voltage swing is large.

Seventh Embodiment

Figure 10A:
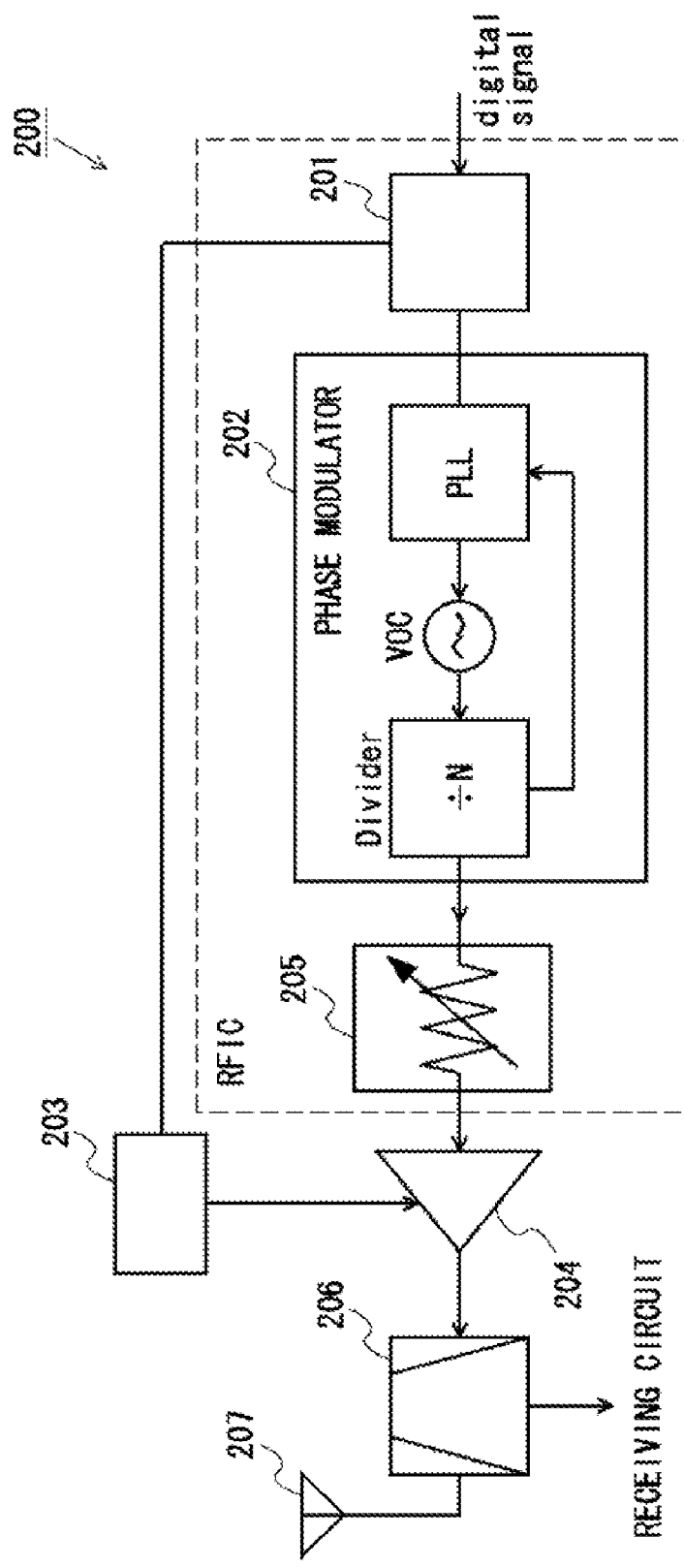
FIG. 10A is a diagram showing an example of the structure of a wireless communication device 200 according to a seventh embodiment of the present invention.

FIG. 10A is an example of the structure of a wireless communication device 200 according to a seventh embodiment of the present invention. Referring to FIG. 10A, an amplitude-phase separation section 201 generates an amplitude component signal and a phase component signal from an input signal (a digital signal). A voltage supply section 203 supplies a voltage corresponding to the amplitude component signal to a power amplifier 204. A phase modulator 202 generates a phase-modulated signal from the phase component signal. The phase modulation sector 202 may include, for example, a PLL, a VCO, and a frequency divider (a divider). The phase-modulated signal is attenuated by a variable attenuator 205 and then inputted to the power amplifier 204. As the variable attenuator 205, any one of the variable attenuators, described in the first through sixth embodiments, is used. The power amplifier 204 amplifies the phase-modulated signal in accordance with the voltage supplied from the voltage supply section 203, thereby outputting a signal of which the phase and the amplitude are combined. The signal outputted from the power amplifier 204 is transmitted from an antenna 207 via a duplexer 206. Due to this structure, it is possible to make the level of the output signal from the wireless communication device 200 highly variable.

Figure 10B:
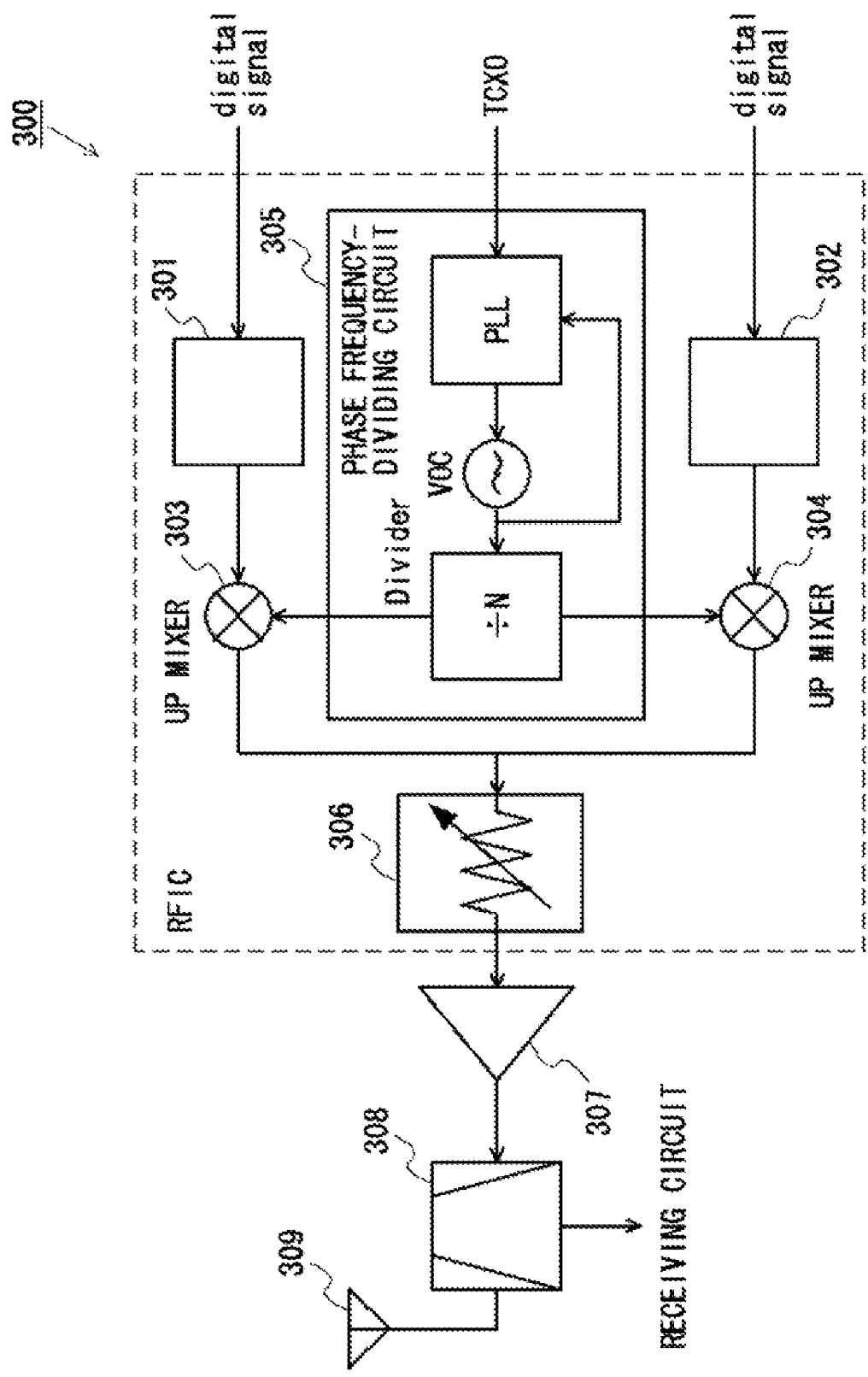
FIG. 10B is a diagram showing an example of the structure of a wireless communication device 300 according to the seventh embodiment of the present invention.
Figure 11:
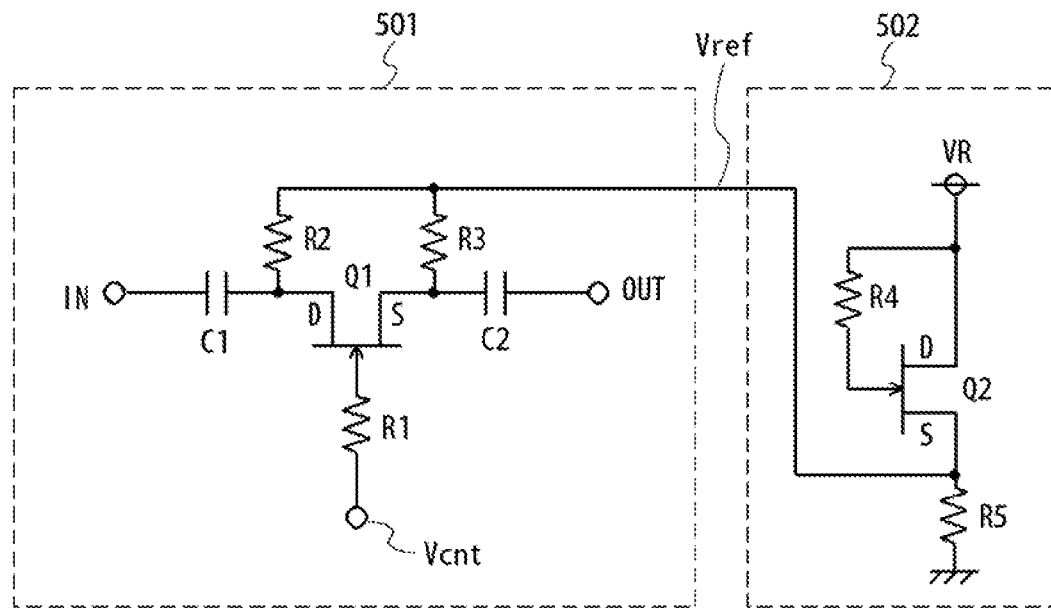
FIG. 11 is a diagram showing the structure of a conventional variable attenuator 501 (a first example)
Figure 12:
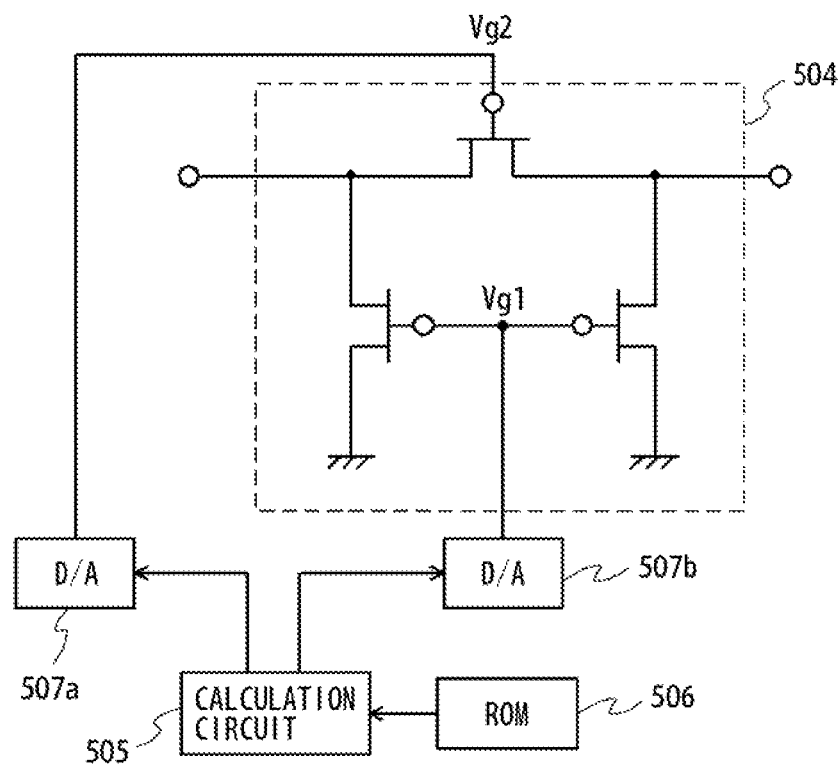
FIG. 12 is a diagram showing the structure of a conventional variable attenuator 504 (a second example)

FIG. 10B is an example of the structure of a wireless communication device 300 according to the seventh embodiment of the present invention. Referring to FIG. 10B, input signals (digital signals) are inputted to mixers 303 and 304 via modulators 301 and 302, respectively. The signals inputted to the mixers 303 and 304 are mixed with output signals from a phase frequency-dividing circuit 305 and are combined together. The combined signal is inputted to a variable attenuator 306. As the variable attenuator 306, any one of the variable attenuators, described in the first through sixth embodiments, is used. The signal attenuated by the variable attenuator 306 is amplified by a power amplifier 307 and is transmitted from an antenna 309 via a duplexer 308. Due to this structure, it is possible to make the level of the output signal from the wireless communication device 300 highly variable.

The variable attenuators of the present invention are suitable for, for example, controlling output power of a transmission circuit, having a wide variable range, of a wireless circuit.

While the invention has been described in detail, the foregoing description is in all aspects illustrative and not restrictive. It is understood that numerous other modifications and variations can be devised without departing from the scope of the invention.

What is claimed is:

1. A variable attenuator comprising:
    a MOSFET including a gate, a source, a drain, and a body;
    an attenuation control circuit for supplying a control voltage to the gate;
    an inverting amplifier for inverting the control voltage to be supplied to the gate, amplifying the inverted control voltage by a predetermined amplification factor, and supplying the inverted and amplified control voltage to the source and the drain; and a temperature characteristics compensation circuit for, in accordance with an operating temperature of the MOSFET, controlling a body voltage to be supplied to the body and adjusting a resistance value between the drain and the source, the temperature characteristics compensation circuit being connected to the body of the MOSFET.

2. The variable attenuator according to claim 1, further comprising:

an input terminal connected to either one of the source and the drain; and an output terminal connected to the other one of the source and the drain, wherein the resistance value between the drain and the source is a resistance value between the input terminal and the output terminal.

3. The variable attenuator according to claim 2, wherein the temperature characteristics compensation circuit includes a triple-well NMOS, the triple-well NMOS having a gate, a drain, a source, and a body, wherein the gate and the drain of the triple-well NMOS are connected to each other, wherein the source and the body of the triple-well NMOS are connected to each other, wherein the drain of the triple-well NMOS is connected to a first reference voltage via a resistor and the source of the triple-well NMOS is connected to a second reference voltage having a lower voltage than that of the first reference voltage, and wherein the MOSFET has a threshold voltage that is set to a predetermined value by supplying, to the body of the MOSFET, a voltage to be applied to the gate and the drain of the triple-well NMOS.

4. The variable attenuator according to claim 2, wherein the temperature characteristics compensation circuit includes a triple-well NMOS, a comparator, and an integrator, wherein the triple-well NMOS has a gate, a drain, a source, and a body, wherein the comparator has a positive terminal, a negative terminal, and an output, wherein the gate of the triple-well NMOS is connected to a first reference voltage, the drain of the triple-well NMOS is connected to a constant-current source, and the source of the triple-well NMOS is connected to ground via a resistor, wherein the positive terminal of the comparator is connected to a second reference voltage, the negative terminal of the comparator is connected to the drain of the triple-well NMOS, and the output of the comparator is connected to the body of the MOSFET and the body of the triple-well NMOS, and wherein the MOSFET has a threshold voltage that is set to a predetermined value by adjusting voltages to be supplied to the body of the MOSFET and the body of the triple-well NMOS so that a drain voltage of the triple-well NMOS is the second reference voltage.

5. The variable attenuator according to claim 4, wherein an A/D converter, a DSP, and a D/A converter are connected in series between the body of the triple-well NMOS and the body of the MOSFET, wherein the A/D converter converts a body voltage of the triple-well NMOS into a digital signal, wherein the DSP outputs an output digital voltage in accordance with the digital signal and a source voltage of the MOSFET, and wherein the D/A converter converts the output digital voltage into an analog voltage.

6. The variable attenuator according to claim 1, wherein the attenuation control circuit is connected to first and second inverting amplifiers each having an output, wherein the output of the first inverting amplifier is connected to ground via a first capacitor and also is connected to the drain of the MOSFET via a first resistor, and wherein the output of the second inverting amplifier is connected to ground via a second capacitor and also is connected to the source of the MOSFET via a second resistor.

7. A wireless communication device including:

an amplitude-phase separation section for generating an amplitude component signal and a phase component signal from a communication signal;

a phase modulator for generating a phase-modulated signal from the phase component signal;

the variable attenuator according to claim 1, connected to the phase modulator, for attenuating the phase-modulated signal outputted from the phase modulator, the variable attenuator having an output terminal;

an amplifier, connected to the output terminal of the variable attenuator, for outputting a signal of which a phase and an amplitude are combined based on the phase-modulated signal, outputted from the output terminal, and the amplitude component signal;

a voltage supply section for supplying a voltage corresponding to the amplitude component signal to the amplifier;

an antenna for transmitting the signal outputted from the amplifier; and a receiving section for receiving, from a predetermined base station, a control signal indicating an output level of the amplifier, wherein the phase-modulated signal to be outputted to the amplifier is attenuated by supplying a voltage value corresponding to the control signal to a control terminal of the variable attenuator.

8. A wireless communication device including:

a modulator for modulating a communication signal and outputting the resultant signal;

an up-converter, connected to the modulator, for up-converting the resultant signal outputted from the modulator;

the variable attenuator according to claim 1, connected to the up-converter, for attenuating the signal outputted from the up-converter, the variable attenuator having an output terminal;

an amplifier, connected to the output terminal of the variable attenuator, for amplifying a signal outputted from the output terminal;

an antenna for transmitting a signal outputted from the amplifier; and a receiving section for receiving, from a predetermined base station, a control signal indicating an output level of the amplifier, wherein the signal to be outputted to the amplifier is attenuated by supplying a voltage value corresponding to the control signal to a control terminal of the variable attenuator.

9. A variable attenuator comprising:

a MOSFET including a gate, a source, a drain, and a body;

an input terminal connected to either one of the source and the drain;

an output terminal connected to the other one of the source and the drain;

an attenuation control circuit for supplying a control voltage to the gate;

an inverting amplifier for inverting the control voltage to be supplied to the gate, amplifying the inverted control voltage by a predetermined amplification factor, and supplying the inverted and amplified control voltage to the source and the drain; and a temperature characteristics compensation circuit for, in accordance with an operating temperature of the MOSFET, controlling a body voltage to be supplied to the body and adjusting a resistance value of between the input terminal and the output terminal, the temperature characteristics compensation circuit being connected to the body of the MOSFET.

10. A variable attenuator comprising:

a first MOSFET including a gate, a source, a drain, and a body;

a second MOSFET including a gate, a source, a drain, and a body;

an attenuation control circuit for supplying a control voltage to the gate of the first MOSFET and the gate of the second MOSFET;

an inverting amplifier for inverting the control voltage to be supplied to the gate of the first MOSFET and the gate of the second MOSFET, amplifying the inverted control voltage by a predetermined amplification factor, and supplying the inverted and amplified control voltage to at least either the source and the drain of the first MOSFET or the source and the drain of the second MOSFET; and a temperature characteristics compensation circuit for, in accordance with operating temperatures of the first MOSFET and the second MOSFET, controlling a body voltage to be supplied to the body of the first MOSFET and the body of the second MOSFET and adjusting resistance values between the respective drains and, the temperature characteristics compensation circuit being connected to the body of the first MOSFET and the body of the second MOSFET.

* * * * *

UNITED STATES PATENT AND TRADEMARK OFFICE
CERTIFICATE OF CORRECTION

| | |
|---|---|
| PATENT NO. | : 7,710,181 B2 |
| APPLICATION NO. | : 12/193114 |
| DATED | : May 4, 2010 |
| INVENTOR(S) | : Toshifumi Nakatani et al. |

It is certified that error appears in the above-identified patent and that said Letters Patent is hereby corrected as shown below:

In column 16, claim 8, (original claim 10), line 51, "the signal" should read --a signal--.

Signed and Sealed this

Seventeenth Day of August, 2010

David J. Kappos
*Director of the United States Patent and Trademark Office*